United States Patent [19]

Shvartsman

[11] Patent Number: 4,692,709

[45] Date of Patent: Sep. 8, 1987

[54] PARALLEL INPUT SIGNAL PROCESSOR FOR LOW-LEVEL SIGNAL, HIGH-NOISE ENVIRONMENTS

[75] Inventor: Vladimir A. Shvartsman, Louisville, Ky.

[73] Assignee: Electronic Design & Research, Inc., Louisville, Ky.

[21] Appl. No.: 720,264

[22] Filed: Apr. 5, 1985

[51] Int. Cl.[4] ............. H03K 5/22; H03K 19/23; H03F 1/26
[52] U.S. Cl. .................. 328/108; 307/464; 307/241; 330/149
[58] Field of Search ............ 328/108, 115, 103, 116, 328/165; 330/136, 149; 307/241–243, 464

[56] References Cited

U.S. PATENT DOCUMENTS

| | | | |
|---|---|---|---|
| 3,737,674 | 6/1973 | Butler, Jr. | 307/242 |
| 4,198,633 | 4/1980 | Krajewski | 328/165 |
| 4,300,101 | 11/1981 | Shvartsman | 330/149 |

Primary Examiner—Stanley D. Miller
Assistant Examiner—B. P. Davis
Attorney, Agent, or Firm—Banner, Birch, McKie & Beckett

[57] ABSTRACT

In a parallel input signal processor, parallel input signals are processed using logic (selective weight) averaging. A multiple number of signal detectors are placed relatively close together at the location at which signal detection is desired. The polarity of each of the input signals, with respect to a threshold value, is determined. If at least a predetermined number of the input signals have the same polarity with respect to the threshold value, the signals having the same polarities are amplified, combined, and averaged to form an output signal. Those signals not having identical polarities with the least predetermined number of signals are not included in the output signal. In the event that the number of input signals in coincidence with respect to the threshold value are not at least this predetermined number, no output signal is produced. The predetermined number is at least a majority of the input signals. By requiring that at least a majority of signals have the same polarity and only processing those majority of signals, noise, defined as those signals not having identical polarities, is eliminated, thus improving signal quality.

4 Claims, 3 Drawing Figures

FIG. 3

| INPUTS (ADDRESS) | | | | | | | | OUTPUTS | | | |
|---|---|---|---|---|---|---|---|---|---|---|---|
| Q1 | Q2 | Q3 | Q4 | Q5 | Q6 | Q7 | Q8 | A | B | C | D |
| 1 | 1 | 1 | 1 | 1 | 1 | 1 | 1 | 1 | 1 | 1 | 1 |
| 0 | 1 | 1 | 1 | 1 | 1 | 1 | 1 | 1 | 0 | 1 | 1 |
| 1 | 0 | 1 | 1 | 1 | 1 | 1 | 1 | 1 | 0 | 1 | 1 |
| 1 | 1 | 0 | 1 | 1 | 1 | 1 | 1 | 1 | 0 | 1 | 1 |
| 1 | 1 | 1 | 0 | 1 | 1 | 1 | 1 | 1 | 0 | 1 | 1 |
| 1 | 1 | 1 | 1 | 0 | 1 | 1 | 1 | 1 | 0 | 1 | 1 |
| 1 | 1 | 1 | 1 | 1 | 0 | 1 | 1 | 1 | 0 | 1 | 1 |
| 1 | 1 | 1 | 1 | 1 | 1 | 0 | 1 | 1 | 0 | 1 | 1 |
| 1 | 1 | 1 | 1 | 1 | 1 | 1 | 0 | 1 | 0 | 1 | 1 |
| 0 | 0 | 1 | 1 | 1 | 1 | 1 | 1 | 1 | 0 | 0 | 1 |
| 0 | 1 | 0 | 1 | 1 | 1 | 1 | 1 | 1 | 0 | 0 | 1 |
| 0 | 1 | 1 | 0 | 1 | 1 | 1 | 1 | 1 | 0 | 0 | 1 |
| 0 | 1 | 1 | 1 | 0 | 1 | 1 | 1 | 1 | 0 | 0 | 1 |
| 0 | 1 | 1 | 1 | 1 | 0 | 1 | 1 | 1 | 0 | 0 | 1 |
| 0 | 1 | 1 | 1 | 1 | 1 | 0 | 1 | 1 | 0 | 0 | 1 |
| 0 | 1 | 1 | 1 | 1 | 1 | 1 | 0 | 1 | 0 | 0 | 1 |
| 1 | 0 | 0 | 1 | 1 | 1 | 1 | 1 | 1 | 0 | 0 | 1 |
| 1 | 0 | 1 | 0 | 1 | 1 | 1 | 1 | 1 | 0 | 0 | 1 |
| 1 | 0 | 1 | 1 | 0 | 1 | 1 | 1 | 1 | 0 | 0 | 1 |
| 1 | 0 | 1 | 1 | 1 | 0 | 1 | 1 | 1 | 0 | 0 | 1 |
| 1 | 0 | 1 | 1 | 1 | 1 | 0 | 1 | 1 | 0 | 0 | 1 |
| 1 | 0 | 1 | 1 | 1 | 1 | 1 | 0 | 1 | 0 | 0 | 1 |
| 1 | 1 | 0 | 0 | 1 | 1 | 1 | 1 | 1 | 0 | 0 | 1 |
| 1 | 1 | 0 | 1 | 0 | 1 | 1 | 1 | 1 | 0 | 0 | 1 |
| 1 | 1 | 0 | 1 | 1 | 0 | 1 | 1 | 1 | 0 | 0 | 1 |
| 1 | 1 | 0 | 1 | 1 | 1 | 0 | 1 | 1 | 0 | 0 | 1 |
| 1 | 1 | 0 | 1 | 1 | 1 | 1 | 0 | 1 | 0 | 0 | 1 |
| 1 | 1 | 1 | 0 | 0 | 1 | 1 | 1 | 1 | 0 | 0 | 1 |
| 1 | 1 | 1 | 0 | 1 | 0 | 1 | 1 | 1 | 0 | 0 | 1 |
| 1 | 1 | 1 | 0 | 1 | 1 | 0 | 1 | 1 | 0 | 0 | 1 |
| 1 | 1 | 1 | 0 | 1 | 1 | 1 | 0 | 1 | 0 | 0 | 1 |
| 1 | 1 | 1 | 1 | 0 | 0 | 1 | 1 | 1 | 0 | 0 | 1 |
| 1 | 1 | 1 | 1 | 0 | 1 | 0 | 1 | 1 | 0 | 0 | 1 |
| 1 | 1 | 1 | 1 | 0 | 1 | 1 | 0 | 1 | 0 | 0 | 1 |
| 1 | 1 | 1 | 1 | 1 | 0 | 0 | 1 | 1 | 0 | 0 | 1 |
| 1 | 1 | 1 | 1 | 1 | 0 | 1 | 0 | 1 | 0 | 0 | 1 |
| 1 | 1 | 1 | 1 | 1 | 1 | 0 | 0 | 1 | 0 | 0 | 1 |
| ALL OTHERS | | | | | | | | 0 | 0 | 0 | 0 |

PARALLEL INPUT SIGNAL PROCESSOR FOR LOW-LEVEL SIGNAL, HIGH-NOISE ENVIRONMENTS

BACKGROUND OF THE INVENTION

1. Technical field

The present invention is directed to a signal processor for selectively processing a plurality of signals. In the preferred embodiment, the signal processor selectively combines and averages random, non-periodic, low-level signals mixed with very high-noise contamination based on logic (selective weight) averaging.

2. Background Information

In many signal processing applications, it is frequently necessary to detect and process signals where the noise component is significant in comparison to the signal's information component. In fact, in many such noise contaminated environments, the noise component itself is larger than the information component. This very often occurs when the signal's amplitude is low and noise contamination will statisically be larger than information amplitude.

For example, electrical signals are generated as a result of the conduction system of the heart of the human body. These electrical signals have very small amplitudes and are ordinarily not detectable by the usual detection means of a simple amplifying circuit due to the magnitude of inherent environmental noise. This problem occurs in other small-amplitude information, high-amplitude noise environments, such as detecting other small-amplitude biological signals, such as those arising from the central nervous system, as well as signals in the field of space exploration, sound engineering, electron spin resonance devices, photochemical measurement, communication systems, and the like.

A number of different techniques are known in the art for reducing noise in low level signal measurements. In U.S. Pat. No. 3,126,449 issued to J. Shirman on Mar. 24, 1964, a noise discriminator circuit is shown having a logic circuit for opening a gate to pass the input signal in the event that the input signal has certain frequency characteristics. The logic circuitry includes a plurality of parallel channels for passing signals having the selected frequency characteristics and logically combining these signals to open the gate to pass the input signal. As a result, this circuit selectively discriminates against input signal noise of certain frequencies outside of the pass band.

Parallel input analog averaging techniques are also known in the art, as shown in U.S. Pat. No. 4,300,101 issued to the same inventor as the present invention, and incorporated herein by reference. In this patent, several parallel input signals are combined in an analog averaging circuit which utilize an analog averaging technique. This combined signal is fed through a variable gain amplifier, amplified, and output only in the event that the instantaneous polarity of all of the parallel input signals have the same value. In other words, only when all parallel input signals are either positive or negative will the input signals be averaged, amplified, and output. Such a circuit is shown to yield a signal amplification of N (the variable gain amplifier's gain factor) and a noise amplification of only the square root of N. As N is usually a very large number (i.e., 10,000), signal output is significantly higher than noise output, and thus the signal-to-noise ratio is significantly enhanced.

However, the problem with the analog averaging technique is that, in order to realize significant signal-to-noise ratios, a large number of parallel inputs must be used. This not only increases total system cost, but also degrades the overall performance of the system. Degradation occurs because, as more parallel inputs are added, the chances of all of the input values being mutually coincident statistically decreases. As coincidence is the criteria for signal output, a statistically lower number of signal averages will be output, thus reducing overall performance.

SUMMARY OF THE INVENTION

It is an object of the present invention to realize significant signal-to-noise ratios without the need for a large number of parallel inputs.

It is also an object of the present invention to output a processed signal without the requirement of all input signals having the same polarity value.

It is further an object of the present invention to process signal information in real time and without the need for knowledge of prior signal characteristics.

It is also an object of the present invention to provide a signal processor which is simple in design and inexpensive to manufacture.

The present invention is directed to a parallel input signal processor using logic (selective weight) averaging. A multiple number of signal detectors are placed relatively close together at the location at which signal detection is desired. For example, detectors may be placed on a body surface above a beating heart to measure its electrical characteristics; on a multiple number of dish antennas (one detector per antenna), all antennas focused on the same site for multiple signal averaging; any other application where an average of several simultaneous measurements is desired; or any other application where it is possible to obtain a phased signal. Each detected signal is input to one of the parallel inputs of the present invention and individually amplified by a programmable gain amplifier. Each input signal also is input to a threshold coincidence network which determines the instantaneous polarity of each of the input signals. If at least a majority of these input signals have the same polarities with respect to a threshold value, those signals having identical polarities are added together, averaged over the number of such signals added together, and output. If at least a majority of these input signals do not have the same polarity, no output is produced.

One advantage of the present invention over the prior art analog averaging systems is that a predetermined number of the input signals, less than all but at least a majority, must have the same instantaneous value in order to produce an output signal. This allows for a greater tolerance of error, and is especially beneficial in systems having a large number of parallel inputs.

Another advantage of the present invention over the prior art analog averaging systems is that only those input signals that are in coincidence are added and averaged, provided that the requisite number of signals have the same instantaneous polarity, without the need for having all of the input signals being identical in polarity. In systems having many parallel inputs, to improve the system's signal-to-noise ratio, the number of output signals produced will be statistically higher than prior art systems which require that all of the input signals have identical polarities. Thus, the overall system performance is improved by outputting a statistically higher number of input samples.

Furthermore, by only including in the output signal those input signals with identical polarities, the input signals which are designated as noise are eliminated. This further improves the overall system performance by isolating and eliminating input noise from the output signal.

BRIEF DESCRIPTION OF THE DRAWINGS

FIG. 3 is a logic table for the positive and negative control logic circuitry shown in FIG. 2.

DETAILED DESCRIPTION OF THE PREFERRED EMBODIMENT

Figure 1:
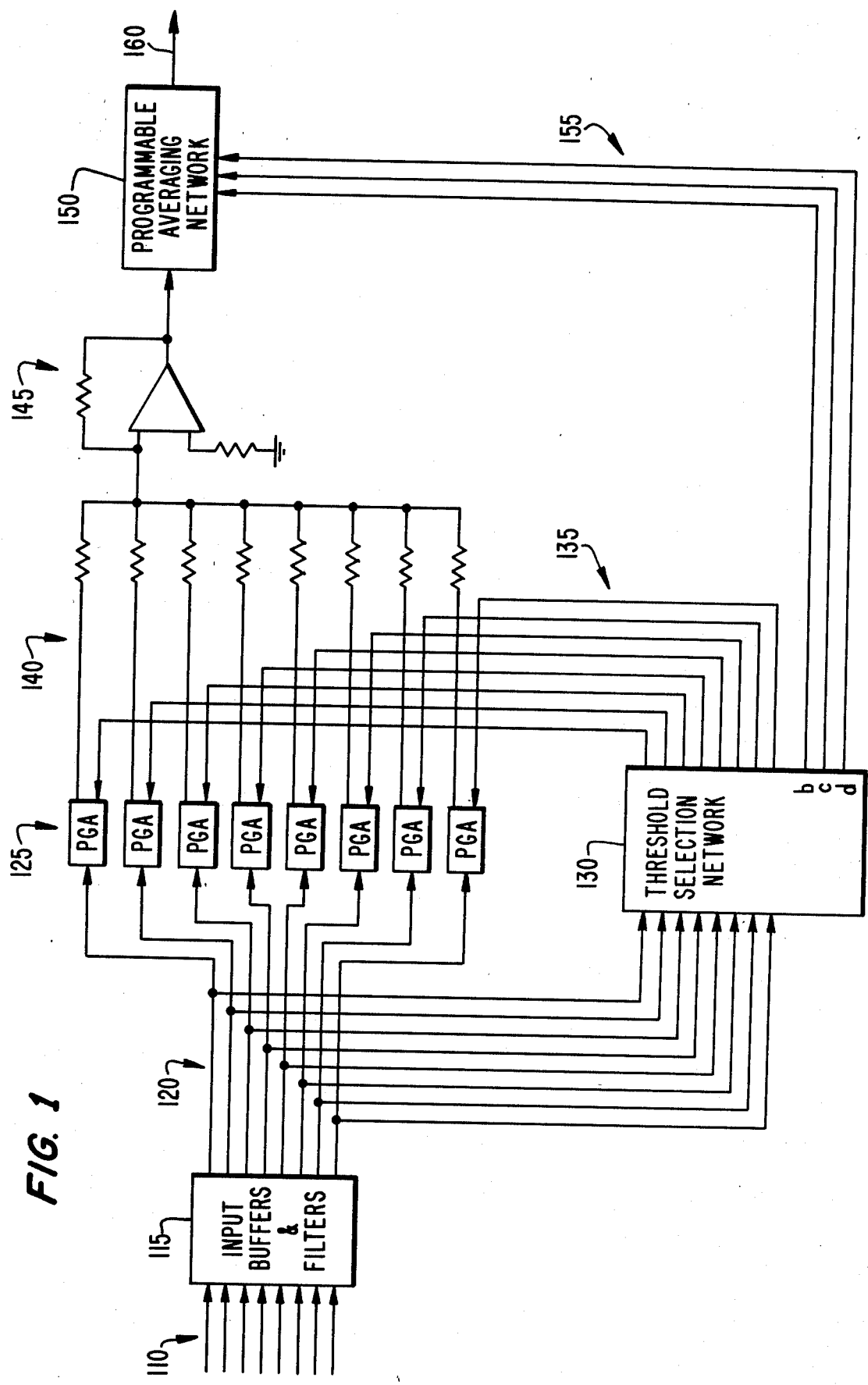
FIG. 1 is a block diagram of the signal enhancer of the present invention.

Turning now to FIG. 1, the preferred embodiment of the present invention is now discussed. Input signals 110, obtained from suitable transducers (not shown), are applied to input buffers and filters 115. In the preferred embodiment, the signals 110 are analog, and are obtained from transducers located at a relatively close proximity to each other on a test piece being monitored.

The circuit 115 buffers the input signals 110 and filters out extraneous or unwanted frequency information. In the preferred embodiment, the input signals 110 are low frequency signals of 30 to 400 Hertz. This frequency range is by way of example only, and is not meant to limit the scope of the present invention. The input buffers are preferably instrumentation preamplifiers which amplify this frequency range. As the measured input signals are low frequency, the system is very sensitive to the 60 Hertz power line noises. To remove this noise, along with its higher harmonics, the filters are preferably 60 Hertz comb reject filters.

The buffered and filtered signals 120 are input to programmable gain amplifiers (PGA's) 125 and a threshold selection network 130. Each programmable gain amplifier 125 is controlled by an individual control line 135 to produce an amplified signal 140 only when its corresponding control line is high. If its corresponding control line is low, no signal is output by that programmable gain amplifier.

The threshold selection network 130 produces the individual PGA's control signals 135 according to the instantaneous value of the buffered and filtered signals 120. If at least a majority of signals 120 have the same instantaneous polarity when compared to a predetermined threshold value, the threshold selection network 130 generates individual control signals 135, selecting those PGA's whose input signals 120 correspond to the signals whose instantaneous polarities with respect to the threshold value are identical. In the preferred embodiment, if at least six of the eight input signals 120 have identical polarities, control signals 135 are generated which allow these at least six buffered and filtered signals to be amplified by their respective PGA. If at least six input signals do not have the same instantaneous polarity, the system treats all of the inputs as being too noise contaminated, unreliable as valid data, and no output is produced. The circuit diagram of the threshold selection network 130 is described in detail below with reference to FIG. 2.

If at least the requisite number of signals 120 have identical instantaneous polarities, those signals having identical instantaneous polarities are amplified by their respective PGA's and these amplified signals 140 are combined by summing amplifier 145 and averaged by programmable averaging network 150.

The programmable averaging network 150 receives the combined signal from the output of the summing amplifier 145 and divides this signal by the number of signals combined. For example, if six of the eight signals 120 have the same instantaneous polarities, the network 150 divides the combined signal by six. The averaging network 150 is controlled by control signals 155, generated by the threshold selection network 130. As more fully explained below with reference to FIG. 2, the control signals 155 are preferably digital signals. Those marked (b) and (c) determine the averaging coefficient, and (d) allows the averaged signal to be output as signal 160.

The design and operation of the programmable averaging network 150 is well known to one skilled in the art. In the preferred embodiment, the control lines (b) and (c) control the feedback arrangement of an amplifier, the gain being a function of the averaging coefficient. The control line (d) controls a gate which passes the output signal 160 to additional circuitry, such as additional buffers, filters, recording or displaying circuitry (not shown).

Figure 2:
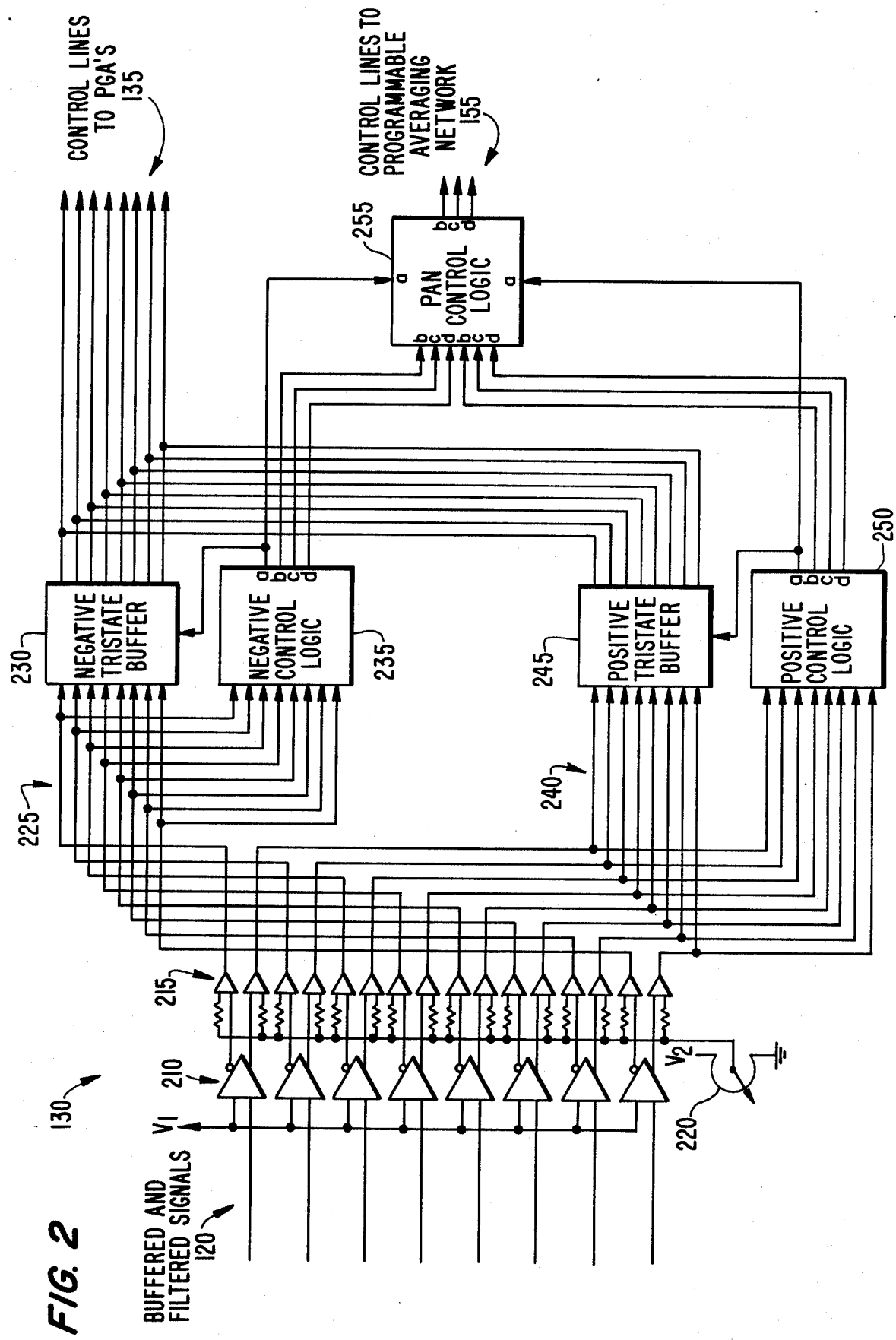
FIG. 2 is a circuit diagram of the threshold selection network shown in FIG. 1.

Turning now to FIG. 2, a description of the preferred embodiment of the threshold selection network 130 of FIG. 1 is now discussed. Each buffered and filtered signal 120 is input to one of the differential amplifiers 210. Each differential amplifier 210 has two outputs, one is the difference between the input 120 and the voltage value $V_1$, the other is the negative of this difference. In the preferred embodiment, $V_1$ is at ground potential.

The differential signals from the differential amplifier 210 are input to comparators 215. Each set of comparators, corresponding to the two outputs from each differential amplifier 210, compares the differential amplifier's output signals against a predetermined threshold voltage, set by potentiometer 220.

The comparators 215 output either a +5 volt signal, when the differential amplifer's signal is greater than the threshold voltage, or a ground potential signal, when the differential amplifier's signal is less than or equal to the threshold voltage. Thus, for each set of comparators 215, one outputs +5 volts, the other outputs ground potential.

The first set of comparator output signals 225 corresponds to the eight comparator output signals which compares the negative differential value from the differential amplifier 210 to the threshold value. These output a ground potential voltage (digital zero) when the negative value from the differential amplifier 210 is below the threshold value. The negative tristate buffer 230 outputs control lines 135 to PGAs 125 of FIG. 1 only when the requisite number of signals 225 have polarities below the threshold value.

In the preferred embodiment, negative control logic 235 inverts the signals 225 and uses them as an address into a read-only memory (ROM) device, outputting control signals (a)-(d) according to the logic chart of FIG. 3. (The signals 225 are inverted so that the same logic chart could be used with positive control logic 250, described below.)

As shown in FIG. 3, when at least six of the inputs have identical values, output (a) from the negative control logic 235 is high, enabling negative tristate buffer 230 so as to output control lines 135 to PGAs 125 of FIG. 1. The inputs 225 are digital zero when true but the PGAs require a digital 1 control value. Therefore, negative tristate buffer 230 outputs an inverted version of input signal 225.

The second set of comparator output signals 240 corresponds to the eight comparator output signals which compares the actual differential value from the differential amplifier 210 to the threshold value. These output a +5 voltage (digital 1) when the positive value from the differential amplifier 210 is above the threshold value. The positive tristate buffer 245 outputs control lines 135 to PGAs of FIG. 1 only when the requisite number of signals 240 have polarities above the threshold value.

The positive control logic 250 takes the signals 240 as its address, outputting control signals (a)–(d) according to the logic chart of FIG. 3. If at least six of the signals 240 have identical polarities, output (a) is high, enabling positive tristate buffer 250 to output control lines 135 to the PGAs 125 of FIG. 1.

The threshold selection network 130 can receive any combination of values above (digital 1) or below (digital 0) the threshold value. When at least six signals are above this threshold value, the positive tristate buffer 245 is enabled by control line (a) from positive control logic 250, and control lines (b)–(d) are sent to the programmable averaging network (PAN) control logic 255. Similarly, when at least six signals are below the threshold value, the negative tristate buffer 230 is enabled by control line (a) from negative control logic 235, and control lines (b)–(d) are sent to PAN control logic 255. The corresponding control logic's control line (a) also enables PAN control logic 255 to output the appropriate control lines (b)–(d) as control lines 155 for the programmable averaging network 150 of FIG. 1.

As shown in FIG. 3, when at least six input signals 120 have the same polarity, both the tristate buffer enable (a) and the programmable averaging network (PAN) enable (d) are high. Outputs (b) and (c) control PAN's averaging coefficient. When both (b) and (c) are high, PAN divides the signal by eight, for all eight lines were combined by summing network 145. Similarly, when (b) is low and (c) is high, PAN divides by seven, and when both (b) and (c) are low, PAN divides by six.

Should less than six inputs have the same polarity when compared to the threshold value, neither tristate buffer is enabled (control line (a) is low). As there is no valid signal to be output, PAN also is not enabled (control line (d) is low).

In summary, when at least six of the eight buffered and filtered signals 120 have identical polarities, those at least six signals are passed through a programmable gain amplifier 125, combined by summing network 145, and averaged by programmable averaging network 150. The threshold selection network 130 is designed such that if the requisite number of signals 120 do not have the same polarity, no output signal 160 is produced. If six or more of the signals 120 do have the same polarity, all of the signals having the same polarity signals are combined and averaged to produce the output signal 160. The signals not allowed to pass through their respective programmable gain amplifiers 125 are treated as noise. Therefore, noise is eliminated from the output signal 160 by controlling the programmable gain amplifier's output by control lines 135.

Although illustrative embodiments of the present invention have been described in detail with reference to the accompanying drawings, it is to be understood that the invention is not limited to those precise embodiments and that various changes or modifications may be effected therein by one skilled in the art without departing from the scope or spirit of the invention.

I claim:

1. A device for receiving M input signals and processing at least N of M input signals, said at least N of M input signals being processed only if said at least N input signals have identical instantaneous polarities with respect to a predetermined and user-adjustable threshold value and comprise at least a majority of the M input signals, said device comprising:

threshold value determination means for outputting a predetermined threshold value, said threshold value being variable and adjustable by a user;

threshold means connected to said threshold value determination means for receiving said predetermined threshold value and the M input signals and determining the instantaneous polarity of each of the M input signals with respect to said predetermined threshold value;

N-signal selection means connected to said threshold means for selecting said N of M input signals having identical instantaneous polarities with respect to said predetermined threshold value and not selecting the (M-N) input signals whose instantaneous polarities are not identical with respect to the instantaneous polarities of said N input signals;

determination means connected to said N-signal selection means for outputting a control signal indicative of the value of N; and processing means connected to said N-signal selection means for processing said N selected signals according to said control signal if and only if said control signal is indicative of the fact that N is greater than M/2.

2. In a device which receives M input signals and processes at least N of the M input signals should at least a majority of the M input signals have identical instantaneous polarities with respect to a predetermined variable threshold value, the method of selectively processing said N input signals comprising the steps of:

determining the value of said variable threshold value;

determining the instantaneous polarity of each of the M input signals with respect to said predetermined threshold value;

selecting said N of M input signals having identical instantaneous polarities with respect to said predetermined threshold value and not selecting the (M-N) input signals whose instantaneous polarities are not identical with respect to the instantaneous polarities of said N input signals;

determining the value of N; and processing said N selected signals according to the value of N if and only if N is greater than M/2.

3. The device of claim 1 wherein said processing means outputs the average value of said N selected signals, said processing means comprising:

summation means for summing said N selected signals; and controllable output means for dividing said summed signal by the value N and outputting said divided signal if and only if N is greated than M/2.

4. In the device of claim 2, said processing including averaging, wherein the step of processing said N selected signals comprises the steps of:

summing said N selected signals; and dividing said summed signal by N and outputting said divided signal as the averaged signal if and only if N is greater than M/2.

* * * * *